April 28, 1970 W. G. CROUSE ET AL 3,509,369

ABSOLUTE VALUE FUNCTION GENERATOR

Filed July 12, 1967 2 Sheets-Sheet 1

*INVENTORS*
WILLIAM G. CROUSE
WALTER S. DUSPIVA
BY John C Black
*ATTORNEY*

April 28, 1970 W. G. CROUSE ET AL 3,509,369

ABSOLUTE VALUE FUNCTION GENERATOR

Filed July 12, 1967 2 Sheets-Sheet 2

United States Patent Office 3,509,369
Patented Apr. 28, 1970

3,509,369

ABSOLUTE VALUE FUNCTION GENERATOR

William G. Crouse, Raleigh, N.C., and Walter S. Duspiva, Endicott, N.Y., assignors to International Business Machines Corporation, Armonk, N.Y., a corporation of New York Filed July 12, 1967, Ser. No. 652,796
Int. Cl. G07g 7/12; H03k 5/153
U.S. Cl. 307—230 7 Claims

ABSTRACT OF THE DISCLOSURE

An electronic switch responds to the polarity of input signals to an operational amplifier of the differential amplifier type and connects the signals to one or both of the differential amplifier input terminals. The amplifier gain is alternatively plus or minus one to provide a low-cost absolute value function generator accurate at low voltage levels in the order of plus and minus five-tenths volt.

BACKGROUND OF THE INVENTION

The invention pertains to the field of analog circuits, and specifically to a circuit which reproduces at its output signals of the same amplitude as the input signals but of one polarity irrespective of the polarity of the input signal. Such circuits are frequently referred to as absolute value function generators. Known circuits of this type usually utilize a pair of operational amplifiers and diode-current steering circuits. Known circuits are characterized by relatively high cost, low performance at low voltage levels and relatively poor response to rapid changes in the input signal level. Examples of typical prior art circuits are as follows:

(1) Analog Methods by Karplus and Soroka, published in 1959 by McGraw-Hill, specifically pp. 75 and 76; and (2) Computer Handbook by Huskey and Korn, published in 1962 by McGraw-Hill, specifically pp. 3–73.

It is an object of the present invention to provide a lower cost, improved performance absolute value function generator.

SUMMARY OF THE INVENTION

An improved absolute value function generator is provided by electronically switching the input signal to one or both of a pair of input terminals to an operational amplifier of the differential amplifier type, depending upon the polarity of the input signal. When the signal is applied to one of the inuts, the gain of the operational amplifier is plus one. When the input signal is applied to both inputs, the gain of the operational amplifier is minus one. By providing only one operational amplifier, the overall cost of the circuit in relation to accuracy is considerably reduced.

The input switch includes a differential amplifier to sense input signal polarity with additional amplifying stages for high gain. The last stage performs the switching function. This permits accurate operation at voltage levels much lower than a volt. The differential portion of the switch includes a pair of transistors preferably having matched base-emitter voltage-current characteristics for good temperature stability. In addition, the impedance presented by the final amplifier stage is very low compared to that provided by oppositely poled diodes of prior art devices. This provides significantly better accuracy at extremely low voltages close to zero volts.

The improved generator exhibits better performance in an environment of rapid changes in the input signal level.

The foregoing and other objects, features and advantages of the invention will be apparent from the following more particular description of preferred embodiments of the invention, as illustrated in the accompanying drawings.

DESCRIPTION OF THE PREFERRED EMBODIMENTS

In the analog circuit field, it is often desirable to generate an output voltage which is the absolute value of some positive or negative input voltage. Mathematically, this may be written as:

$$E_{out}=+E_{in} \text{ for } 0\leq E_{in}\leq E_{max}$$

and $$E_{out}=-E_{in} \text{ for } -E_{max}\leq E_{in}\leq 0$$

The drawings illustrate an improved absolute value generator configuration, and the evolution of the configuration.

Figure 3:
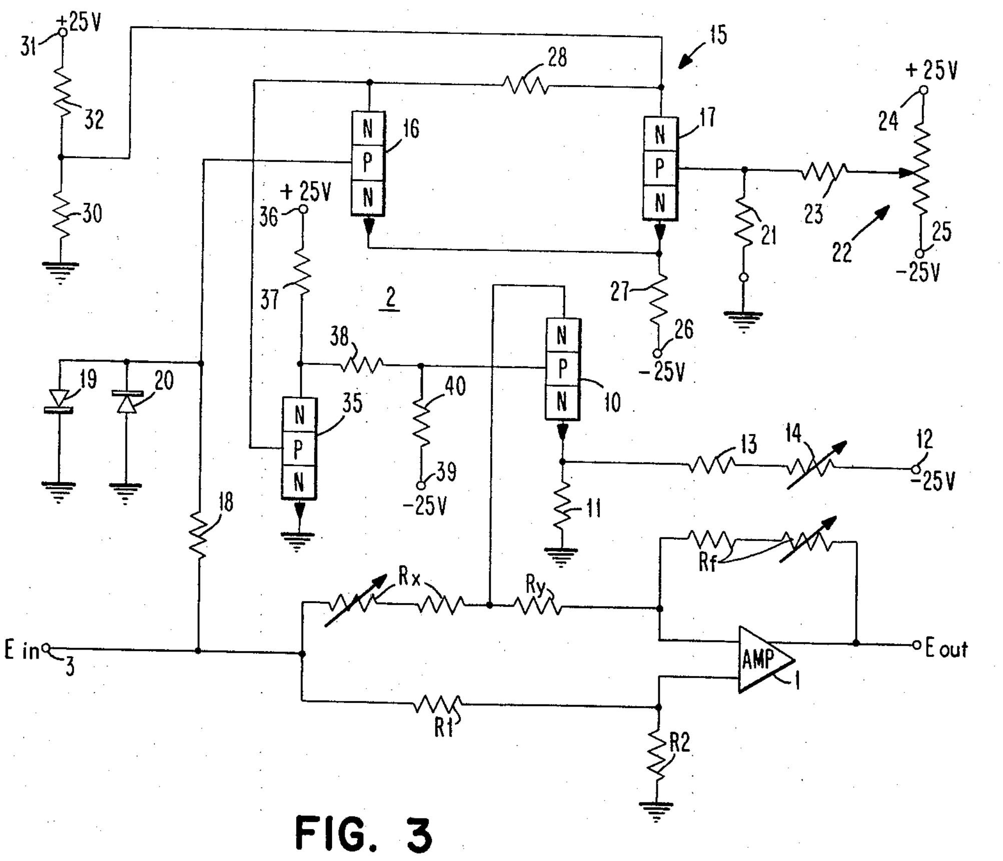
FIG. 3 is a schematic diagram illustrating one preferred form of the improved function generator.

The basic circuits around which the improved circuit is built are a differential input operational amplifier 1 and a voltage threshold-switch device 2 (FIG. 3). The device 2 switches impedance levels for the differential amplifier as the polarity of the input voltage changes, thus setting the gain of the entire system to plus one for positive inputs and minus one for negative inputs. Before the circuit of FIG. 3 is explained in detail, a brief review of two common feedback circuits is of value.

Figure 1A:
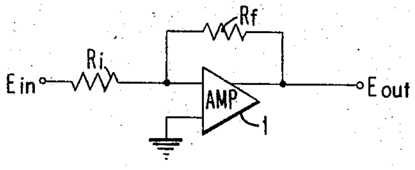
FIGS. 1*a*–1*d* inclusive illustrate various operational amplifier characteristics to aid in a better understanding of the improved function generator.

FIG. 1*a* shows the most commonly used scheme for incorporating a differential input operational amplifier as a feedback device. The gain of this circuit is approximately equal to the negative ratio of the feedback resistor to the input resistor, i.e.

$$\text{Gain}=\left(\frac{E_{out}}{E_{in}}\right)\simeq-\left(\frac{Rf}{Ri}\right)$$

Figure 1B:
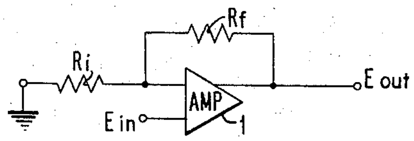

A less common configuration is shown in FIG. 1*b*. In this embodiment, the polarity of the gain is positive, i.e.

$$\text{Gain}\simeq\left(\frac{E_{out}}{E_{in}}\right)\approxeq+\left[1+\left(\frac{Rf}{Ri}\right)\right]$$

It would seem possible then that some combination of both configurations, together with a threshold switching device, might result in a circuit that has a gain of either plus or minus one, depending upon the polarity of the input signal.

Figure 1C:
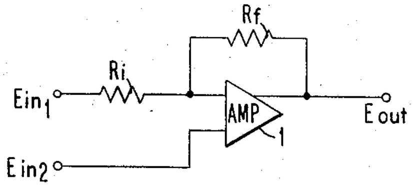

If the configurations of FIGS. 1*a* and 1*b* are combined as illustrated in FIG. 1*c*, the resultant circuit is one that includes two inputs. The equation for the output voltage in FIG. 1*c* is as follows:

$$E_{out}\simeq E_{in_1}\left(-\frac{Rf}{Ri}\right)+E_{in_2}\left[1+\left(\frac{Rf}{Ri}\right)\right]$$

Figure 1D:
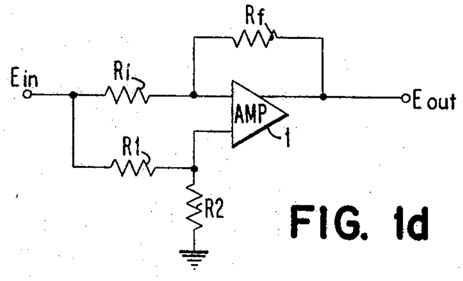

To make the circuit even more specialized, allow the second input, $E_{in_2}$, to be proportional to the first input, $E_{in_1}$, as shown in FIG. 1*d*, giving rise to the circuit equation:

$$\text{Gain}=\left(\frac{E_{out}}{E_{in}}\right)\approxeq\left\{\left(-\frac{Rf}{Ri}\right)+\left[1+\left(\frac{Rf}{Ri}\right)\left[\frac{R2}{R1+R2}\right]\right\}\right.$$

It can be seen from an analysis of the equation, that the gain of the circuit in FIG. 1*d* may be either positive or negative, depending upon the value of the four resistors external to the operational amplifier, i.e. R1, R2, R$i$ and R$f$. If these resistance values were to be switched properly by a zero input threshold device, the gain of the system could be set to either plus or minus one, thus effecting the desired absolute value function.

Figure 2B:
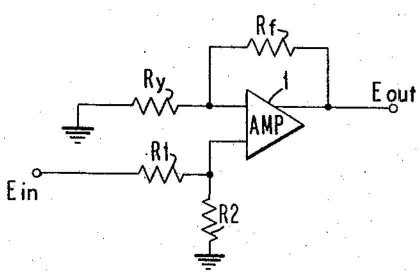
FIGS. 2*b* and 2*c* illustrate the manner in which the embodiment of FIG. 2*a* operates in either of its two states.
Figure 2C:
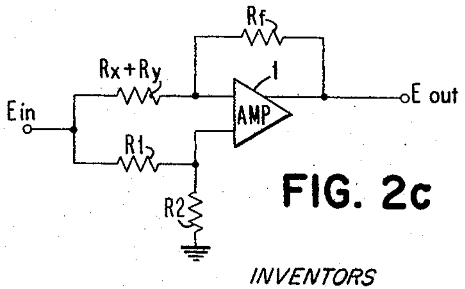
Figure 2A:
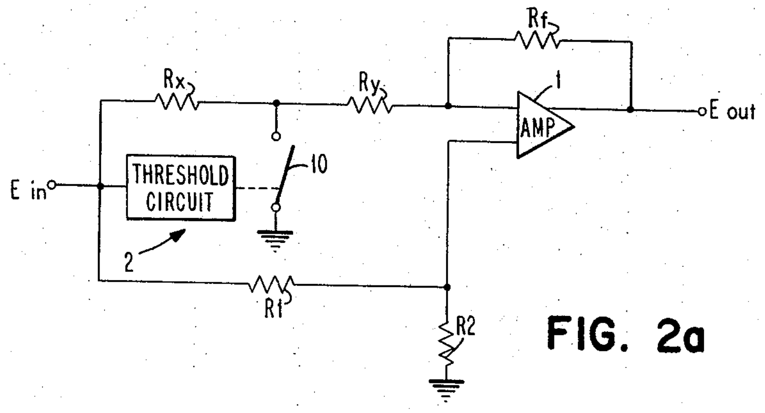
FIG. 2*a* illustrates the improved function generator partially in schematic form and partially in diagrammatic form.

One method of properly controlling the impedances is to break the input resistor R$i$ into two series input resistors R$x$ and R$y$, as shown in FIG. 2$a$. The threshold device controls a switch to connect the junction of the resistors R$x$ and R$y$ to ground potential. The switch is closed for input voltages which are zero or positive and is open for input voltages which are negative. Then, depending upon the position of the switch, the amplifier will be utilized in one of the two configurations of FIG. 2$b$ or FIG. 2$c$. FIG. 2$b$ illustrates the amplifier connections of the embodiment of FIG. 2$a$ when the switch is closed incident to detection of a positive polarity at the input. FIG. 2$c$ shows the amplifier connections when the switch is open due to a negative potential at the input.

The component values which will achieve the desired results in FIG. 2$a$ can be determined by use of the formulas set forth below. It will be recalled that a gain of plus one is desired for the configuration of FIG. 2$b$ and a gain of minus one for FIG. 2$c$. Arbitrarily assign the following values:

| | Ohms |
|---|---|
| R1 | 10,000 |
| R2 | 1,000 |
| R$f$ | 100,000 |

The values of R$x$ and R$y$ must now be determined, utilizing the following equations:

FOR POSITIVE INPUTS $$\left(\frac{E_{out}}{E_{in}}\right)\simeq+1\simeq\left[\frac{R2}{R1+R2}\right]\left[1+\left(\frac{Rf}{Ry}\right)\right] \quad (1)$$

FOR NEGATIVE INPUTS $$\left(\frac{E_{out}}{E_{in}}\right)\simeq-1 \simeq\left\{\left[\frac{R2}{R1+R2}\right]\left[1+\left(\frac{Rf}{Rx+Ry}\right)\right]\right\}-\left\{\frac{Rf}{Rx+Ry}\right\} \quad (2)$$

By substituting the values of R1, R2 and R$f$ in Equation 1 above, we compute the value of R$y$ to be ten thousand ohms.

Substituting the values of R1, R2, R$f$ and R$y$ into Equation 2 above, we find the value of R$x$ to equal seventy-three thousand, three hundred ohms.

It will be appreciated that this is not the only set of component values which will produce the desired results. However, it has been found that these particular values give results which are quite good when practical factors (such as the linearity of the transistors used in the threshold circuit, etc.) are taken into consideration.

In a practical circuit, the switch illustrated in FIG. 2$a$ is replaced by some type of transistor switching arrangement which detects the polarity and level of the input signal and clamps the junction of R$x$ and R$y$ to ground potential when the polarity of the input signal is positive. The transistor switching circuit 2 of FIG. 3 serves this purpose very well.

The preferred embodiment of FIG. 3 will now be described in detail. In FIG. 3, the amplifier 1 has one input connected to ground potential by way of the resistor R2. The same input is connected to the input terminal 3 by way of the resistor R1. The other input of the amplifier 1 is connected to the terminal 3 by way of the resistors R$y$ and R$x$. The resistor R$x$ is shown in the form of a fixed resistor and an adjustable potentiometer for accurate sizing. The feedback resistor R$f$ is also in the form of a fixed resistor and an adjustable potentiometer for accurate dimensioning.

The junction between the resistors R$x$ and R$y$ is connected to ground potential by way of a common emitter transistor amplifier 10 and a low-valued resistor 11. The emitter electrode of the amplifier 10 is connected to a negative supply terminal 12 by way of a resistor 13 and an adjustable potentiometer 14.

The voltage divider comprising resistors 11 and 13 and potentiometer 14 fixes the emitter potential of transistor 10 at a low neagtive voltage equal in value to the V$ce$ drop across the transistor 10 when it is operated at saturation. This will set the collector voltage of the transistor 10 at ground potential when it is saturated.

The input terminal 3 is connected to one input of a differential amplifier switch 15 comprising a pair of transistors 16 and 17. More specifically, the input terminal 3 is connected to the base electrode of the transistor amplifier 16 by way of a resistor 18. The base electrode of the transistor amplifier 16 is clamped to ground potential by way of oppositely poled diodes 19 and 20. The function of these diodes is to limit the amplitude of signals applied to the base electrode of the transistor by way of resistor 18.

The base electrode of the transistor amplifier 17 is connected to ground potential by way of a resistor 21 and to the wiper of a potentiometer 22 by way of a resistor 23. The potentiometer 22 is connected to positive and negative supply terminals 24 and 25 and the wiper is adjusted so that it is close to ground potential.

The emitters of the transistors 16 and 17 are connected to a negative supply terminal 26 by way of a common resistor 27. A resistor 28 connects the collector electrode of the transistor 16 to the collector electrode of the transistor 17. The collector electrode of the transistor 17 is connected to ground potential by way of a resistor 30 and to a positive supply terminal 31 by way of a resistor 32.

The collector electrode of the transistor 16 is connected directly to the base electrode of a common emitter transistor amplifier 35. The collector electrode of the amplifier 35 is connected to a positive supply terminal 36 by way of a resistor 37. The collector electrode of the amplifier 35 is also connected to the base electrode of the transistor 10 by way of a resistor 38. The base electrode of the transistor 10 is connected to a negative supply terminal 39 by way of a bias resistor 40.

The potentiometer 22 is set so that the transistors 16 and 17 conduct equally when the input signal $E_{in}$ is at ground potential. The gain of the system will therefore be undefined when the input is at ground potential; however, no problem arises since $E_{in}$ equals zero and the output $E_{out}$ will therefore equal zero. When $E_{in}$ goes slightly positive, the transistor 16 becomes saturated and the transistor 17 turns off. When $E_{in}$ goes slightly negative, the transistor 17 saturates and transistor 16 turns off.

When the transistor amplifier 35 is in its off state, the positive potential from the supply terminal 36 will bias the transistor switch 10 on to saturation, thereby substantially connecting ground potential to the junction between the resistors R$x$ and R$y$. This occurs only when the transistor 16 is in its highly conductive condition as a result of the input signal $E_{in}$ being at a positive potential with respect to ground.

When the input signal $E_{in}$ is at some negative potential, the transistor 16 is in its low conductivity state, whereby the transistor 35 is turned on to apply ground potential to the base circuit of the transistor switch 10. With the transistor 35 in its conductive state, the swich 10 is turned off, presenting an open circuit to the junction between the resistors R$x$ and R$y$.

The use of extremly well-matched transistors 16 and 17 will obviate the need for the adjustment potentiometer 22.

The use of a transistor 10 having an unusually low impedance at saturation will obviate the need for the adjustment potentiometer 14 and resistors 13 and 11. In addition, a fixed value resistor can be used for R$x$.

These resistors and potentiometers permit the use of a lower performance, low-cost transistor switch without adversely affecting accuracy.

Chart 1 below sets forth the test results with respect to two circuits constructed in accordance with the details of FIG. 3, utilizing the following component values. The circuits for which the test results are set forth in Chart 1, utilized the same resistive components and operational amplifier, but different transistors were utilized to verify satisfactory operation of the circuit independent of the transistors utilized. The component values for one suitable implementation of the embodiment of FIG. 3 are as follows:

| | Ohms |
|---|---|
| R1 | 9,988 |
| R2 | 9,971 |
| Rx | 72,380 |
| Ry | 9,939 |
| Rf | 99,590 |
| 11 | 3.3 |
| 13 | 10,000 |
| 14 | 11,660 |
| 18 | 2,400 |
| 21 | 1,100 |
| 22 | 50,000 |
| 23 | 5,100 |
| 28 | 24,000 |
| 30 | 560 |
| 32 | 560 |

CHART NO. 1

| Input (volts) | Circuit No. 1 output (volts) | Circuit No. 2 output (volts) |
|---|---|---|
| +.010 | .010 | .010 |
| +.100 | .100 | .100 |
| +1.000 | 1.000 | 1.000 |
| +3.000 | 3.000 | 3.000 |
| +5.000 | 5.000 | 4.998 |
| +8.000 | 8.001 | 7.998 |
| +10.000 | 10.002 | 9.997 |
| −.010 | .019 | .019 |
| −.100 | .108 | .108 |
| −1.000 | 1.008 | 1.008 |
| −3.000 | 3.006 | 3.007 |
| −5.000 | 5.003 | 5.006 |
| −8.000 | 8.000 | 8.004 |
| −10.000 | 9.998 | 10.001 |

While the invention has been particularly shown and described with reference to preferred embodiments thereof, it will be understood by those skilled in the art that the foregoing and other changes in form and details may be made therein without departing from the spirit and scope of the invention.

What we claim is:

1. An absolute value function generator comprising
an operational amplifier of the differential amplifier type having a pair of input terminals and an output terminal,
an input circuit including at least two input resistor means each serially connected to a respective one input terminal and adapted to receive bipolar input signals and including negative feedback resistor means connected to one of the input terminals normally biasing the amplifier for operation with a gain of minus one,
electronic switch means responsive to the input signals for modifying the input resistor means to change the gain of the amplifier to plus one when the input signals are of a selected polarity.

2. An absolute value function generator comprising
an operational amplifier of the differential amplifier type having a pair of input terminals and an output terminal,
input resistor means adapted to receive bipolar input signals and feedback resistor means normally biasing the amplifier for operation with a gain of minus one,
control means modifying the input resistor means to change the gain of the amplifier to plus one when the input signals are of a selected polarity,
a source of ground potential and a single input signal terminal,
said feedback resistor means connected between the amplifier output terminal and one of the amplifier input terminals, and
said input resistor means including
first and second series resistors connecting the signal input terminal to said one amplifier input terminal, and
third and fourth series resistors connecting the signal input terminal to ground potential,
the junction between the third and fourth resistors being connected to the other amplifier input terminal.

3. The function generator of claim 2 wherein the control means includes
a switch for selectively connecting the junction between the first and second resistors to ground potential to change the gain of the amplifier from minus one to plus one.

4. The function generator of claim 3 wherein the control means further includes
first transistor amplifier means connected to the input terminal and responsive to the polarity of the input signals to render the switch alternatively effective or ineffective.

5. The function generator of claim 4 wherein the transistor amplifier means render the switch effective to connect the junction between the first and second resistors to ground potential when the polarity of the input signals is positive.

6. The function generator of claim 5 wherein the switch comprises
a common emitter transistor amplifier having its collector electrode coupled to the junction between the first and second transistors and having its emitter electrode coupled to ground potential.

7. The function generator of claim 5 wherein said first transistor amplifier means comprises a high gain differential amplifier.

References Cited

UNITED STATES PATENTS

| | | | |
|---|---|---|---|
| 3,281,723 | 10/1966 | Mercer | 307—235 X |
| 3,292,098 | 12/1966 | Bensing | 330—69 |
| 3,305,729 | 2/1967 | Stein | 307—235 |
| 3,413,492 | 11/1968 | Schneider | 307—235 |

JOHN S. HEYMAN, Primary Examiner

U.S. Cl. X.R.

307—235, 236; 330—30, 69